(12) United States Patent
Wood et al.

(10) Patent No.: US 6,400,550 B1
(45) Date of Patent: Jun. 4, 2002

(54) VARIABLE CAPACITORS INCLUDING TANDEM MOVERS/BIMORPHS AND ASSOCIATED OPERATING METHODS

(75) Inventors: Robert L. Wood, Cary; Vivek Agrawal, Durham; Ramaswamy Mahadevan; Edward A. Hill, both of Chapel Hill, all of NC (US)

(73) Assignee: JDS Uniphase Corporation, San Jose, CA (US)

( * ) Notice: Subject to any disclaimer, the term of this patent is extended or adjusted under 35 U.S.C. 154(b) by 0 days.

(21) Appl. No.: 09/860,213

(22) Filed: May 18, 2001

Related U.S. Application Data
(60) Provisional application No. 60/245,770, filed on Nov. 3, 2000.

(51) Int. Cl.[7] .................................................. H01G 5/01
(52) U.S. Cl. ........................ 361/277; 361/278; 361/298.2
(58) Field of Search .................................. 361/277–278, 361/281, 282, 299.5, 298.2, 298.4, 298.5, 290

(56) References Cited

U.S. PATENT DOCUMENTS
6,229,684 B1    5/2001    Cowen et al. .............. 361/278

*Primary Examiner*—Anthony Dinkins
(74) *Attorney, Agent, or Firm*—Myers Bigel Sibley & Sajovec

(57) ABSTRACT

A variable capacitor is provided having first and second capacitor plates, a tandem mover and an actuator. The first and second capacitor plates are positioned such that the first and second capacitor plates face one another in a spaced apart relationship. The tandem mover is configured to move the first and second capacitor plates in tandem in response to changes in ambient temperature to maintain a consistent spaced apart relationship between the capacitor plates. The actuator is then configured to vary the spaced apart relationship between the first and second capacitor plates in response to an external input. The capacitance of the variable capacitor can therefore be varied by increasing and decreasing the spaced apart relationship between the first and second capacitor plates.

24 Claims, 7 Drawing Sheets

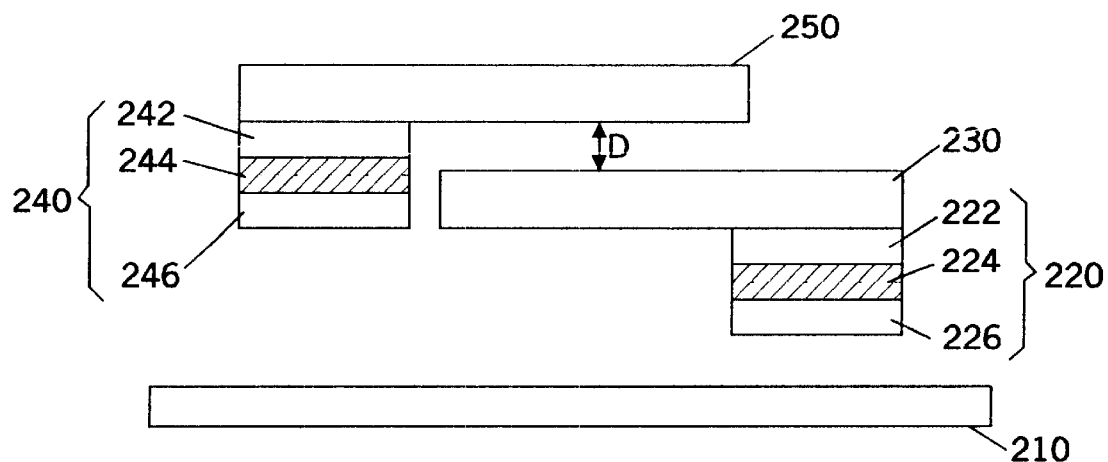
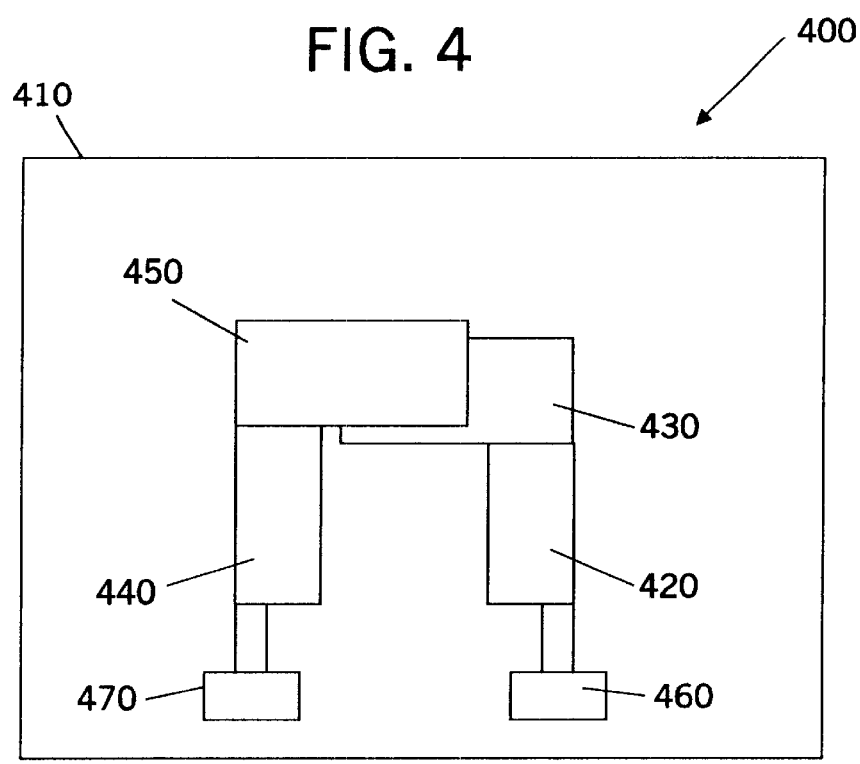

VARIABLE CAPACITORS INCLUDING TANDEM MOVERS/BIMORPHS AND ASSOCIATED OPERATING METHODS

CROSS REFERENCE TO RELATED APPLICATION

This application claims the benefit of provisional application Ser. No. 60/245,770, filed Nov. 3, 2000 now abandoned, entitled MEMS Variable Capacitor With Improved Temperature Compensation, the disclosure of which is hereby incorporated herein by reference in its entirety.

FIELD OF THE INVENTION

The present invention relates generally to microelectromechanical structures (MEMS) and, more particularly, to MEMS variable capacitors and associated operating methods.

BACKGROUND OF THE INVENTION

Various microelectromechanical structures (MEMS) and other microengineered devices exist for providing voltage or current controlled capacitive elements that may be used, for example, in tunable circuits such as voltage controlled oscillators (VCOs). One such MEMS device is a MEMS variable capacitor. Conventional MEMS variable capacitors may include a pair of capacitor plates, one of which is typically disposed upon and fixed to a substrate and the other of which is typically carried by a movable actuator or driver. For example, one such variable capacitor is disclosed in U.S. Pat. No. 6,229,684 to Cowen et al. entitled Variable Capacitor and Associated Fabrication Method, the disclosure of which is incorporated herein by reference. This application discloses one of the capacitor plates disposed on a cantilever and the other of the capacitor plates disposed upon and fixed to a substrate. The capacitor plate disposed on the cantilever is used to vary the separation of the capacitor plates to provide a voltage controlled capacitor, the capacitance of which depends on the amount of separation of the capacitor plates.

SUMMARY OF THE INVENTION

Variable capacitors according to embodiments of the present invention include first and second bimorph members spaced apart from a substrate. A first capacitor plate and a second capacitor plate are mechanically coupled to the first and second bimorph members, respectively. The second capacitor plate is positioned in a spaced apart relationship to the first capacitor plate. An actuator is associated with at least one of the first and second bimorph members and is configured to vary the spaced apart relationship between the first and second capacitor plates. In some embodiments of the present invention the actuator is associated with both the first and the second bimorph members. The actuator may be a thermal actuator, an electrostatic actuator and/or an electromagnetic actuator.

In some embodiments of the present invention, the first bimorph member and second bimorph member comprise first and second layers having dissimilar thermal coefficients of expansion. In further embodiments of the present invention, the first layer comprises silicon and the second layer comprises nickel. A first and a second insulating layer, for example, silicon nitride, is positioned between the first and second layers.

These first and second bimorph members are configured to respond to changes in ambient temperature, i.e. the thermal environment. Therefore, both bimorph members preferably move in tandem in response to changes in ambient temperature, thus maintaining a consistent spaced apart relationship between the first and second plates that are mechanically coupled to the first and second bimorph members. Accordingly, a current may be provided to one or both of the bimorph members causing the capacitor plates to move together or apart and thereby causing a variation in the capacitance between the capacitor plates. This variation can remain constant notwithstanding changes in ambient temperature.

In further embodiments of the present invention, a variable capacitor is provided having first and second capacitor plates, a tandem mover and an actuator. The first and second capacitor plates are positioned such that the first and second capacitor plates face one another in a spaced apart relationship. The tandem mover, for example, a pair of bimorph members, is configured to move the first and second capacitor plates in tandem in response to changes in ambient temperature to maintain a consistent spaced apart relationship between the capacitor plates. The actuator is then configured to vary the consistent spaced apart relationship maintained by the tandem mover in response to an external input. The capacitance of the variable capacitor can therefore be varied by increasing and decreasing the spaced apart relationship between the first and second capacitor plates, while remaining independent of changes in ambient temperature.

Methods of operating a variable capacitor according to embodiments of the present invention include positioning a first capacitor plate and a second capacitor plate so that the first and second capacitor plates face one another in a spaced apart relationship. These methods further include moving the first and second capacitor plates together (in tandem) in response to changes in ambient temperature to maintain a consistent spaced apart relationship between the first and second capacitor plates. At least one of the first and second capacitor plates is actuated to vary the spaced apart relationship between the first and second capacitor plates in response to an external input to thereby vary the capacitance between the capacitor plates.

In some embodiments of the present invention the variable capacitor includes a third bimorph member that is spaced apart from the substrate. A third capacitor plate is mechanically coupled to the third bimorph member and positioned between the first and second capacitor plates. The actuator is associated with the third bimorph member and configured to increase the spaced apart relationship between the third capacitor plate and one of the first and second capacitor plates and decrease the relationship between the third capacitor plate and the other of the first and second capacitor plates.

In further embodiments of the present invention the variable capacitor includes third and fourth bimorph members that are spaced apart from the substrate. A third and a fourth capacitor plate are mechanically coupled to the third and fourth bimorph members, respectively. The first, second, third and fourth capacitor plates are positioned such that the first, second and third capacitor plates face the fourth capacitor plate. The actuator may be associated with at least one of the first, second, third and fourth capacitor plates and configured to vary the spaced apart relationship between the first, second, third and fourth capacitor plates.

In yet further embodiments of the present invention, the substrate may include a trench. The first and second bimorph members deflect into the trench in response to the actuator.

The first and second bimorph members also deflect into the trench in response to changes in ambient temperature. In other embodiments of the present invention the first and second bimorph members may deflect away from the substrate in response to the actuator.

BRIEF DESCRIPTION OF THE DRAWINGS

FIG. 2B is a cross-sectional view of the variable capacitor of FIG. 2A, taken along line 2A–2A', according to embodiments of the present invention.

FIG. 4 is a top-view of a variable capacitor according to further embodiments of the present invention.

DETAILED DESCRIPTION OF THE INVENTION

Figure 1:
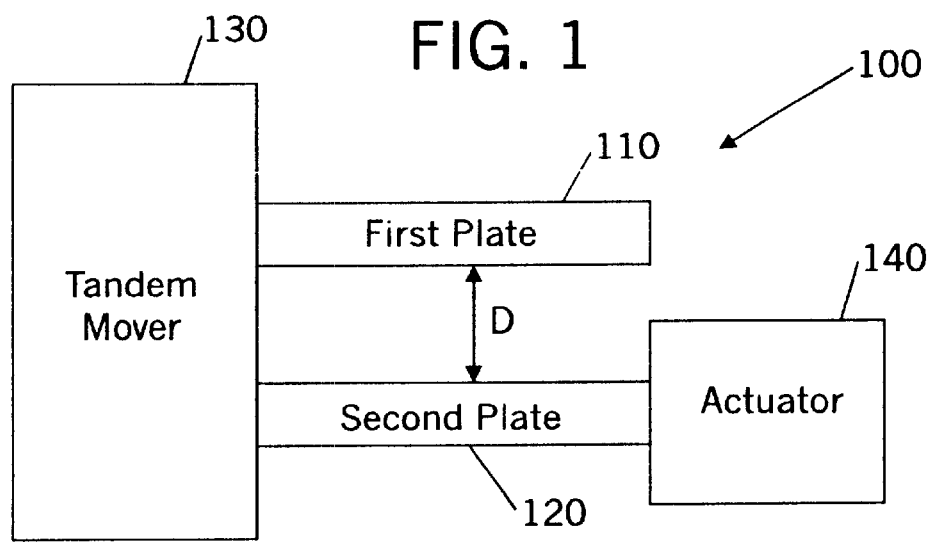
FIG. 1 is a block diagram of a variable capacitor according to embodiments of the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather these embodiments are provided so that this disclosure will be thorough and complete, and will fully convey the scope of the invention to those skilled in the art. In the drawings, the thickness of layers and regions are exaggerated for clarity. Like numbers refer to like elements throughout.

It will be understood that when an element such as a layer, region or substrate is referred to as being "on" another element, it can be directly on the other element or intervening elements may also be present. In contrast, when an element is referred to as being "directly on" another element, there are no intervening elements present. Also, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Referring to FIG. 1, a block diagram of a variable capacitor according to embodiments of the present invention will now be described. A variable capacitor 100 includes a first capacitor plate 110, a second capacitor plate 120, a tandem mover 130 and an actuator 140. The first capacitor plate 110 and the second capacitor plate 120 face one another in a spaced apart relationship as illustrated in FIG. 1. Although the first capacitor plate 110 and the second capacitor plate 120 are shown directly facing one another in FIG. 1, it will be understood that this is for exemplary purposes only and that the invention is not limited to this configuration. Thus, the first and second capacitor plates may be offset. Furthermore, the first and second capacitor plates may be different sizes and/or shapes and may not even be flat.

The tandem mover 130 is configured to move the first capacitor plate 110 and the second capacitor plate 120 in tandem in response to changes in ambient temperature, i.e. the thermal environment. In other words, the tandem mover 130 adjusts the position of both capacitor plates in response to changes in ambient temperature to thereby maintain a consistent spaced apart relationship D between the first capacitor plate 110 and the second capacitor plate 120. For example, an embodiment of a tandem mover may include two identical thermal bimorph members each comprising two layers having different coefficients of expansion. The thermal bimorph members may move in tandem in response to changes in ambient temperature, thus maintaining a consistent spaced apart relationship D between the first capacitor plate 110 and the second capacitor plate 120.

It will be understood by those having skill in the art that the reference spaced apart relationship maintained by the tandem mover does not need to be a constant spaced apart relationship for all temperatures. For example, the reference spaced apart relationship may change by a certain distance X with every 10° variation in ambient temperature. Thus, with every 10° change in ambient temperature the reference spaced apart relationship would be the previous spaced apart relationship increased or decreased by X. The new reference spaced apart relationship may then be varied to modify the capacitance between the first and second capacitor plates as discussed below.

The actuator 140 may be a thermal actuator. The thermal actuator 140 is configured to vary the spaced apart relationship D between the first and second capacitor plates. Although the actuator 140 is shown associated with the second plate in FIG. 1, it will be understood by those having skill in the art that this is for exemplary purposes only and that the invention is not limited to this configuration. For example, the actuator may be associated with the first plate 110 or with both the first plate 110 and the second plate 120. Furthermore, the actuator does not need to be positioned at the end of the capacitor plate as shown in FIG. 1. Rather, the actuator may be in the middle of the capacitor plate or closer to the tandem mover. The spaced apart relationship between the capacitor plates, the area of the capacitor plates and the configuration of the dielectric positioned between the capacitor plates determines the capacitance of the variable capacitor. Thus, increasing the spaced apart relationship D causes the capacitance between the first capacitor plate 110 and the second capacitor plate 120 to decrease.

Although the present invention is described with respect to a thermal actuator, it will be understood that this is for exemplary purposes only and that the invention is not limited to thermal actuation. For example, the variable capacitor may be electrostatically actuated. A voltage may be applied to an electrode on the substrate and to one or both of the capacitor plates causing an electrostatic force that results in increasing or decreasing the spaced apart relationship D between the capacitor plates. Alternatively, the variable capacitor may be electromagnetically actuated by a relay. Combinations of these and other actuation techniques may also be used.

Aspects of the present invention may provide advantages over other variable capacitors that fix a first capacitor plate to a substrate and mechanically couple a second capacitor plate to the end of a bimorph member. Using a thermal bimorph member in conjunction with this configuration of capacitor plates can produce large capacitance changes in relation to changes in ambient temperature. By providing a tandem mover, for example, two thermal bimorph members, the large capacitance changes may be avoided because the tandem mover causes both the first and second capacitor plates to move in response to ambient temperature, thereby maintaining a consistent spaced apart relationship D between the plates. Accordingly, a risk of unwanted capacitance changes can be reduced and preferably virtually eliminated.

Figure 2A:
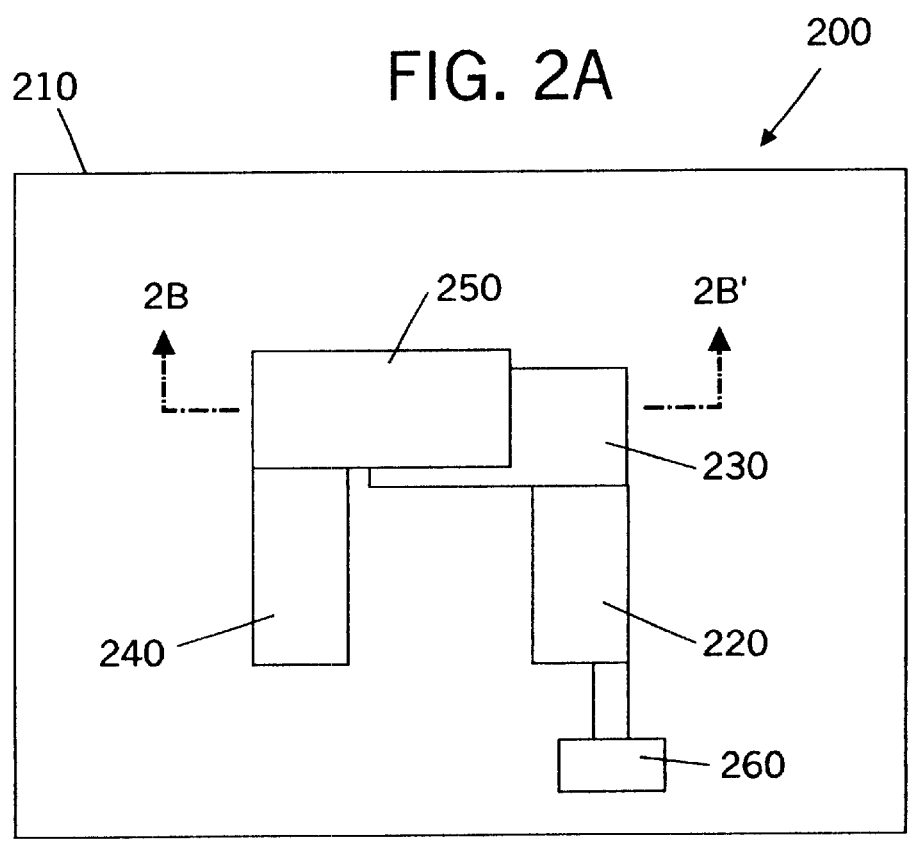
FIG. 2A is a top-view of a variable capacitor on a substrate according to embodiments of the present invention.

Now referring to FIG. 2A, a top-view of a variable capacitor according to embodiments of the present invention will be described. FIG. 2A illustrates a variable capacitor 200 comprising a first bimorph member 220 that is spaced apart from a substrate 210 and a second bimorph member 240 that is also spaced apart from the substrate 210. As discussed above, the first and second bimorph members of FIG. 2A may be an embodiment of a tandem mover. As illustrated in FIG. 2B, a cross-sectional view of the variable capacitor of FIG. 2A, the first bimorph member 220 and the second bimorph member 240 may comprise multiple layers. As further illustrated in FIG. 2B, the first bimorph member 220 may comprise a first layer 222, a first insulating layer 224, and a second layer 226. Similarly, the second bimorph member 240 may comprise a third layer 242, a second insulating layer 244, and a fourth layer 246. Although the bimorph members are each illustrated having two layers and a single insulating layer, those of skill in the art will appreciate that this is for exemplary purposes only and that the bimorph members of the present invention are not limited to this configuration. For example, the insulating layers may be omitted leaving only two layers. The insulting layer 224 electrically isolates the first layer 222 from the second layer 226. In other words, the presence of the insulating layer allows a current to be passed directly through the second layer 226 of the bimorph member without shorting the second layer 226 and the first layer 222 together. The insulating layer may be omitted if electrical isolation of the two layers is not desired.

Figure 3:
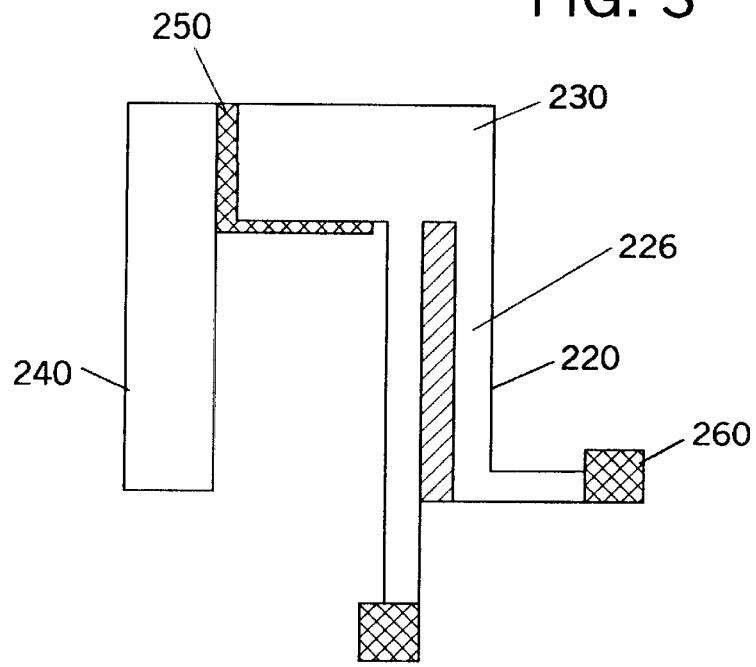
FIG. 3 is a plan view of a variable capacitor illustrating a layout of a bimorph according to embodiments of the present invention.

The first and second layers of the first bimorph member 220 typically have dissimilar thermal coefficients of expansion that respond differently to thermal actuation. Similarly, the third and fourth layers of the second bimorph member 240 typically have dissimilar coefficients of expansion that respond differently to thermal actuation. In the embodiment shown in FIG. 2B, the first layer 222 may comprise a material having a higher coefficient of expansion relative to the material of the second layer, such as gold, nickel, or other metallic material. The second layer 226 may comprise a material having a lower coefficient of expansion relative to the material of the first layer, such as silicon or another suitable semiconductor material. The second layer, or silicon layer, may be split as shown in FIG. 3 so that a current may be passed through the silicon layer. The third and fourth layers may be identical to the first and second layers, respectively. Alternatively, the third and fourth layers may be two different materials having dissimilar coefficients of expansion. It will be understood that that first and second layers may be reversed. Thus, the second layer may be disposed on top of the first layer.

The first and second insulating layers 224 and 244, respectively, are positioned between the other two layers to electrically isolate the other two layers as discussed above. The first 224 and second 244 insulating layers may both comprise, for example, silicon nitride or some other suitable material that may provide electrical isolation of the two other layers. The presence of the insulating layer allows, for example, a current to be passed through one of the layers of the bimorph member without shorting the two layers of the bimorph member together.

Referring again to FIG. 2A, the variable capacitor 200 further comprises a first capacitor plate 230 and a second capacitor plate 250 that are mechanically coupled to the first bimorph member 220 and the second bimorph member 240, respectively. To achieve a desired low loss and high Q that may be desired of a variable capacitor used in high frequency applications, such as those that involve radio frequency (RF) signals, the first and second capacitor plates may be formed of a high temperature super conducting (HTS) material. By way of example, these HTS materials include, Yttrium Barium Copper Oxide (YBCO) and Thallium compounds (TBCCO). These HTS materials are available commercially from Superconductor Technologies Incorporated of Santa Barbara, Calif. In order to allow a low loss filter the substrate is, typically, formed of a low loss material. For example, the substrates may be formed of magnesium oxide (MgO), although other low loss materials, such as $LaAlO_3$ or $NdCaAlO_4$ may also be used for the substrate. The first capacitor plate 230 and the second capacitor plate 250 may be positioned in a spaced apart relationship as shown in FIG. 2B. It will be understood that the first and second capacitor plates do not have to directly face one another as illustrated in FIG. 2B. The capacitor plates may be offset from one another. Furthermore, the first and second capacitor plates may be different sizes and/or different shapes and may not even be flat.

As discussed above, if only one of the capacitor plates is mechanically coupled to a thermal bimorph member and the other capacitor plate is placed directly on the substrate only the capacitor plate attached to the thermal bimorph member is responsive to changes in ambient temperature. Thus, the spaced apart relationship D between the first and second capacitor plates may change in response to changes in ambient temperature which may cause an unwanted variation of capacitance between the first and second capacitor plates. Therefore, as discussed above, both the first and second capacitor plates of the present invention may be mechanically coupled to thermal bimorph members and/or other tandem movers thus reducing and preferably avoiding the unwanted variation in the capacitance between the first and second capacitor plates. Accordingly, both the first and second bimorph members deflect towards or away from the substrate 210 in tandem in response to changes in ambient temperature, therefore maintaining a consistent spaced apart relationship between D between the first and second capacitor plates.

Referring again to FIG. 2A, thermal actuation of the variable capacitor 200 may be provided using one or more actuator pads 260 that may be associated with the first bimorph member 220, the second bimorph member 240 or both the first and second bimorph members 220 and 240, respectively. For example, the actuator pad 260 is shown in FIG. 2A associated with the first bimorph member 220. Thermal actuation may be used to vary the spaced apart relationship D between the first and second capacitor plates 230 and 250, respectively. An electric current may be passed through one of or both of the layers of a bimorph member, thus heating the overall thermal bimorph member which causes the bimorph member to bend in the direction of the material having the lower coefficient of expansion. Applying a current to one of the first and second bimorph members causes and increase the spaced apart relationship D between the first and second capacitor plates resulting in a desired variation of capacitance between the capacitor plates. As discussed above, it will be understood that the actuator does not need to be a thermal actuator. The actuator may also be an electrostatic actuator, an electromagnetic actuator, or the like.

Further embodiments of the present invention will now be described with reference to FIGS. 4 through 9. As discussed above with reference to FIGS. 2A and 2B, the actuator pad may be associated with the first bimorph member, the second bimorph member or both the first and second bimorph members. FIG. 4 illustrates a variable capacitor 400 according to embodiments of the present invention having actuator pads 460 and 470 associated with a first bimorph member 420 and a second bimorph member 440, respectively. As discussed in detail above, both the first and second bimorph members are configured to respond to changes in ambient temperature, thereby maintaining a consistent spaced apart relationship between the first and second capacitor plates that may be altered by the thermal actuation of the first and second bimorph members. Actuator pads 460 and 470 may be used to set a reference spaced apart relationship R between the first and second capacitor plates. For example, the actuator pads 460 and 470 may be used to provide a current to the first bimorph member and the second bimorph member, respectively, until the first and second capacitor plates are a reference distance R apart. This reference distance R may then be altered by providing a current one to one or both of the actuator pads 460 and 470 to vary the capacitance between the first and second capacitor plates.

Figure 5:
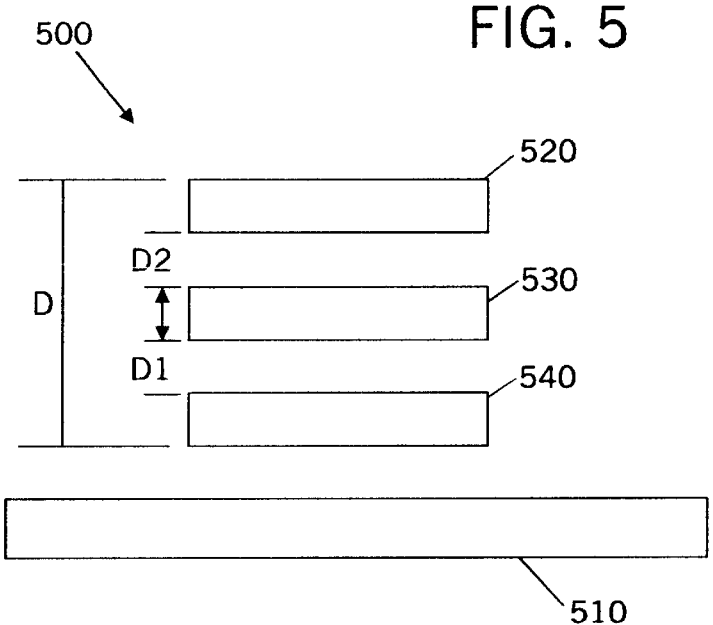
FIG. 5 is a cross-sectional view of a variable capacitor according to other embodiments of the present invention.

Now referring to FIG. 5, a cross-section of a variable capacitor 500 according to embodiments of the present invention will be described. The variable capacitor of FIG. 5 comprises a first capacitor plate 520, a second capacitor plate 530 and a third capacitor plate 540. The first, second and third capacitor plates are mechanically coupled to first, second, and third bimorph members, respectively. The first, second and third bimorph members are spaced apart from the substrate 510. The third capacitor plate 530 is positioned between the first capacitor plate 520 and the second capacitor plate 540 as shown in FIG. 5. The first, second and third capacitor plates all respond to changes in ambient temperature, thus maintaining consistent distances D, D1 and D2 over a wide range of temperatures. Therefore, the first, second and third bimorph members are an embodiment of a tandem mover.

A thermal actuator (not shown) is associated with the third bimorph member. A consistent distance D is maintained between the first capacitor plate 520 and the second capacitor plate 540, i.e. the first and second bimorph members are not actuated. The thermal actuator is configured to increase the spaced apart relationship between the third capacitor plate 540 and one of the first and second capacitor plates and decrease the spaced apart relationship between the third capacitor plate 540 and the other of the first and second capacitor plates. For example, if a current is applied to the third bimorph member, the third capacitor plate 540 will move down towards the second capacitor plate 530 thereby increasing the spaced apart relationship D2 and decreasing the spaced apart relationship D1, thus causing a variation of capacitance between the capacitor plates. Alternatively, the third capacitor plate 540 may move up towards the first capacitor plate 520 thereby decreasing the spaced apart relationship D2 and increasing the spaced apart relationship D1, thus also causing a variation of capacitance between the capacitor plates. This embodiment of the present invention may be used as a differential capacitor.

Figure 6:
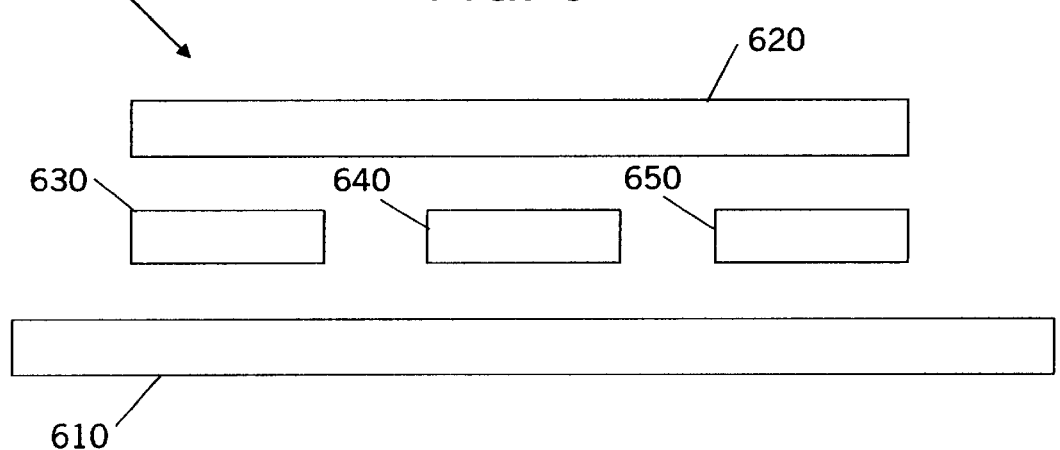
FIG. 6 is a cross-sectional view of a variable capacitor according to still further embodiments of the present invention.

Now referring to FIG. 6, a cross-sectional view of a variable capacitor according to further embodiments of the present invention will be described. The variable capacitor 600 comprises a first capacitor plate 630, a second capacitor plate 640, a third capacitor plate 650 and a fourth capacitor plate 620. The first, second, third and fourth capacitor plates are mechanically coupled to first, second, third and fourth bimorph members, respectively. The first, second, third and fourth bimorph members are spaced apart from the substrate 610. The first 630, second 640, third 650 and fourth 620 capacitor plates are positioned such that the first 630, second 640 and third 650 capacitor plates face the fourth capacitor plate 620 as shown in FIG. 6. It will be understood by those of skill in the art that the first, second and third capacitor plates do not have to directly face the fourth capacitor plate. Thus, the first, second, third and fourth capacitor plates may be offset. Furthermore, the first, second, third and fourth capacitor plates may also be different sizes and/or different shapes and may not even be flat. The first, second, third and fourth bimorph members all move in tandem in response to changes in ambient temperature, thus maintaining a consistent spaced apart relationship and avoiding unwanted changes in capacitance between the capacitor plates. Therefore, the first, second, third and fourth bimorph members are an embodiment of a tandem mover.

A thermal actuator may be associated with at least one of the first, second, third and fourth capacitor plates. For example, a current may be passed through the first, second, third and/or fourth bimorph members causing the spaced apart relationships between the plates to change and thereby varying the capacitance between the various plates. The configuration illustrated by FIG. 6 may be used, for example, to tune multiple LC filters. For example, the capacitor formed by the first capacitor plate 630 and the fourth capacitor plate 620 may be used as a first tuning capacitor (tank capacitor). Furthermore, the capacitor formed by the second capacitor plate 640 and the fourth capacitor plate 620 may be used as a first coupling capacitor. The capacitor formed by the third capacitor plate 650 and the fourth capacitor plate 620 may be used as a second tuning capacitor, and so on.

Figure 7:
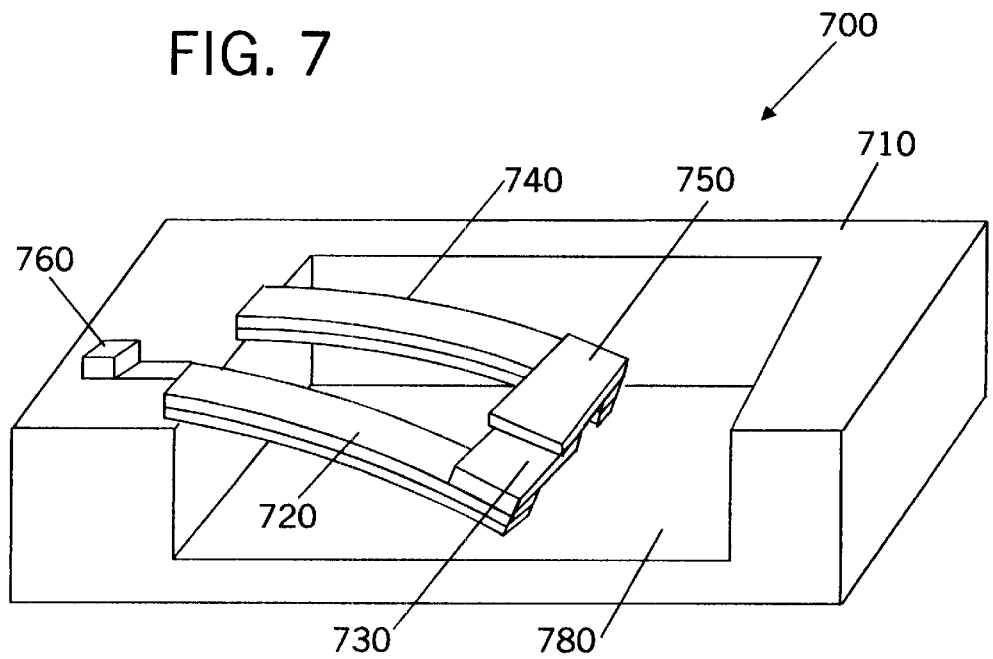
FIG. 7 is a cross-sectional view of a variable capacitor spaced apart from a substrate having a trench into which the bimorph members deflect according to embodiments of the present invention.

As discussed above, a thermal actuator may cause one or more of the bimorph members to deflect towards or away from the substrate. FIG. 7 illustrates an embodiment of the present invention having a trench in the substrate allowing one or more bimorph members to deflect into the trench. FIG. 7 illustrates a variable capacitor comprising a first bimorph member 720 that is spaced apart from a substrate 710 and a second bimorph member 740 that is also spaced apart from the substrate 710. A first capacitor plate 730 and a second capacitor plate 750 are mechanically coupled to the first bimorph member 720 and the second bimorph member 740, respectively. The first and second bimorph members deflect into the trench in response to changes in ambient temperature, thus maintaining a consistent spaced apart relationship and avoiding unwanted changes in capacitance between the plates.

Thermal actuation of the variable capacitor 700 may be provided using one or more actuator pads 760 that may be associated with the first bimorph member 720, the second bimorph member 740 or both the first and second bimorph members 720 and 740, respectively. In FIG. 7, the actuator pad 760 is shown associated with the first bimorph member 720 for exemplary purposes only. Thermal actuation may vary the spaced apart relationship between the first and second capacitor plates 730 and 750, respectively. For example, a current may be passed through the first and/or second bimorph member causing the end of the effected bimorph member(s) to deflect towards the substrate 710 into the trench 780. Assuming each of the bimorph members comprise a first layer of metal disposed on top of a second layer of silicon, passing a current through the silicon layer may cause the metallic layer having the higher coefficient of expansion as discussed above, such as nickel, to expand more readily. The expansion may cause the metallic layer to bend down towards the silicon layer. In effect, the overall bimorph structure will be displaced in a downward direction as shown in FIG. 7. It is understood that both of the bimorph members in this example will deflect into the trench in response to changes in ambient temperature, thereby maintaining a consistent spaced apart relationship between the capacitor plates. Moreover the current passed through the first and/or second bimorph member can cause changes in the spaced apart relationship to thereby provide a variable capacitor that can be relatively insensitive to changes in ambient temperature.

Figure 8:
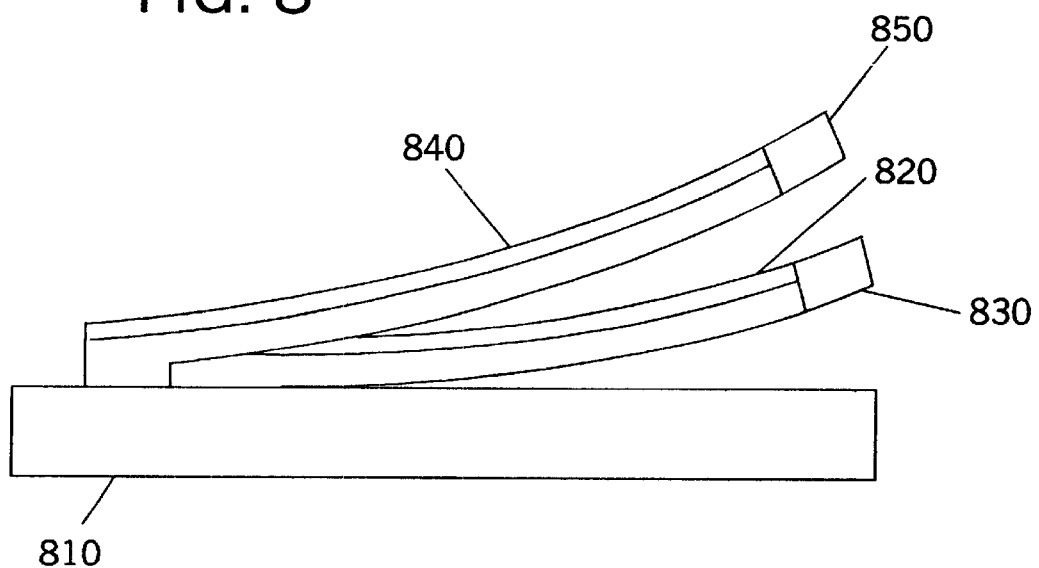
FIG. 8 is a cross-sectional view of a variable capacitor spaced apart from a substrate away from which the bimorph members deflect according to embodiments of the present invention.

Alternatively, as shown in FIG. 8, both the first 820 and second 840 bimorph members may deflect away from the substrate 810 in response to ambient temperature and thermal actuation. For example, a current may be passed through the first and/or second bimorph member causing the end of the effected bimorph member(s) to deflect away from the substrate 810. Assuming each of the bimorph members comprises a layer of titanium disposed on top of a layer of nickel, passing a current through the titanium layer may cause the layer of nickel to expand more readily. The expansion may cause the layer of nickel to bend up towards the layer of titanium. In effect, the overall bimorph member structure will be displaced in an upward direction as shown in FIG. 8. It will be understood that the layers of titanium and nickel may be separated by an insulating layer. The insulating layer electrically isolates the layer of titanium from the layer of nickel. For example, the presence of the insulating layer allows a current to be passed directly through the titanium layer of the bimorph member without shorting the titanium layer and the nickel layer together. Passing the current through only one of the first and second bimorph members may increase the spaced apart relationship between the first and second capacitor plates causing a desired variation of capacitance between the capacitor plates.

Figure 9:
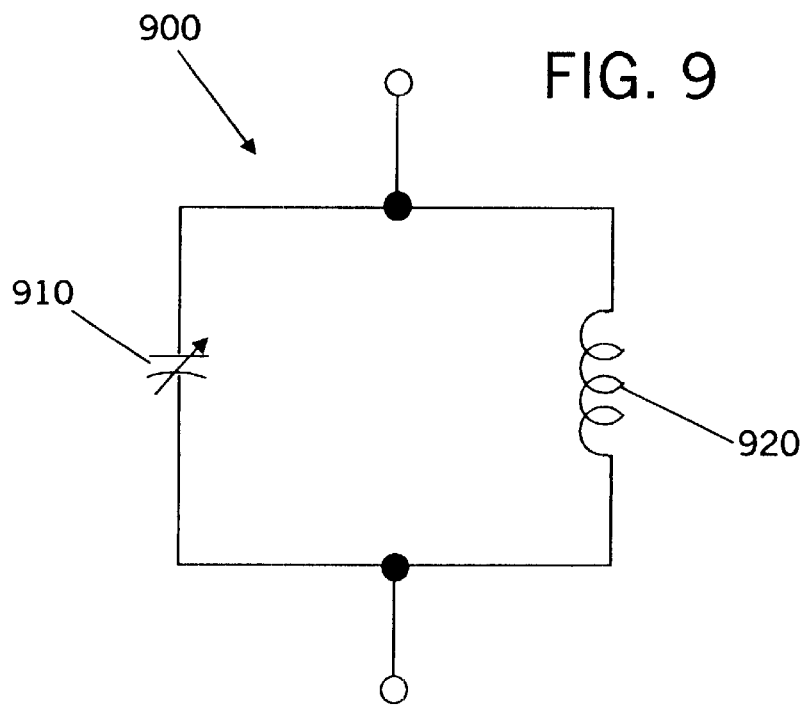
FIG. 9 is a circuit diagram of a variable capacitor in combination with an inductor according to embodiments of the present invention.

Now referring to FIG. 9, a variable capacitor in combination with an inductor according to embodiments of the present invention will be described. A variable capacitor according to embodiments of the present invention may be used as the capacitive element in a tunable circuit. As shown in FIG. 9, a variable capacitor 910 of embodiments of the present invention, for example, the variable capacitors of FIGS. 1 through 8, is coupled to an inductor 920 to create a tuning circuit 900. The tunable nature of the tuning circuit 900 is accomplished by altering the spaced apart relationship of the capacitor plates and thereby varying the capacitance of the variable capacitor as discussed above with respect to embodiments of the present invention. It will be understood that the inductor and the variable capacitor may be combined on a single chip or may be disposed on separate chips. It will also be understood that the although the variable capacitor 910 and the inductor 920 are shown as connected in parallel in FIG. 9, embodiments of the present invention will not be limited to this configuration. For example, the variable capacitor 910 and the inductor 920 may also be connected in series.

Figure 10:
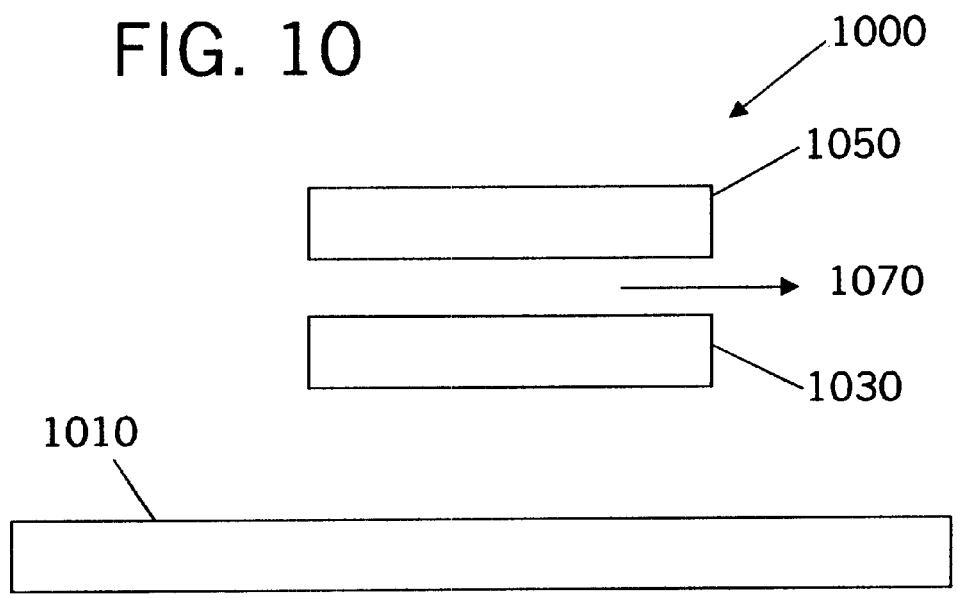
FIG. 10 is a cross-sectional view of a variable capacitor having a dielectric according to embodiments of the present invention.
Figure 11:
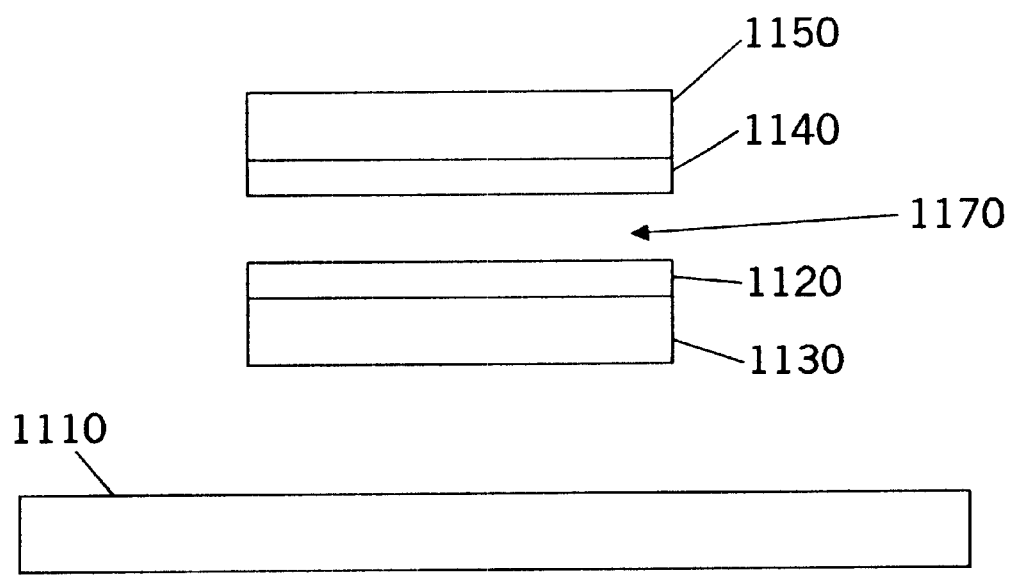
FIG. 11 is a cross-sectional view of a variable capacitor having a compound dielectric according to embodiments of the present invention.

As discussed above, the spaced apart relationship between the capacitor plates, the area of the capacitor plates and the configuration of the dielectric positioned between the capacitor plates may determine the capacitance of the variable capacitor. Variable capacitors according to embodiments of the present invention will now be further described with reference to FIGS. 10 and 11. FIGS. 10 and 11 illustrate cross-sectional views of variable capacitors 1000 and 1100, respectively. The variable capacitor 1000 in FIG. 10 comprises a dielectric 1070 according to embodiments of the present invention. First 1030 and second 1050 capacitor plates are spaced apart from the substrate 1010. A dielectric 1070 will typically be air. Similarly, FIG. 11 illustrates a cross-sectional view of a variable capacitor 1100 comprising a compound dielectric according to embodiments of the present invention. First 1130 and second 1150 capacitor plates may be spaced apart from the substrate 1110. The dielectric may be a compound dielectric typically comprising air 1170 and some other dielectric material, 1120 and 1140, positioned on the first 1130 and second 1150 capacitor plates, respectively.

Figure 12:
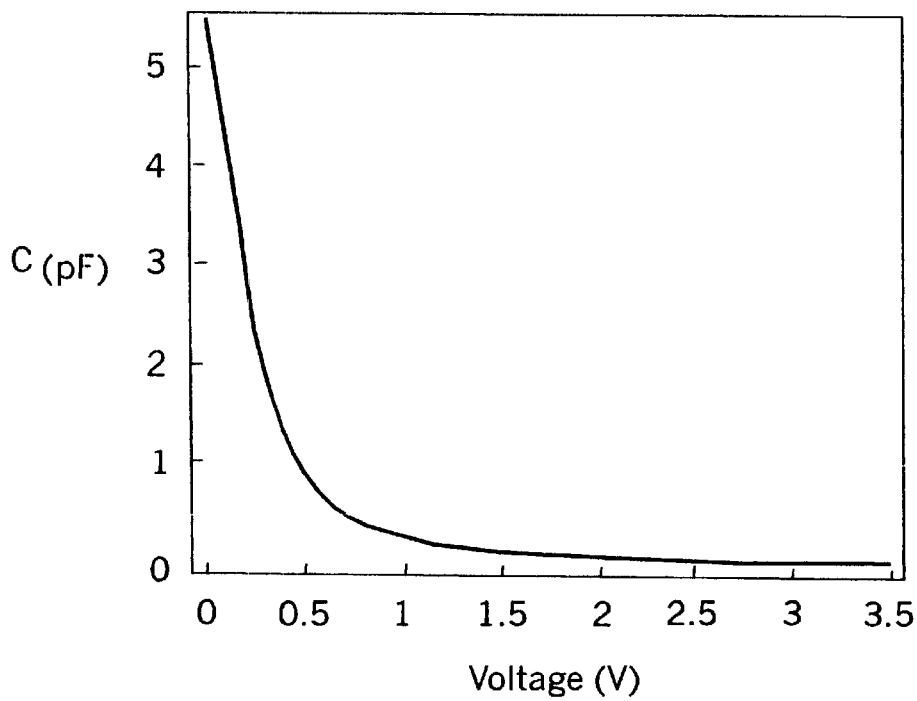
FIG. 12 is a graph illustrating a relationship between normalized frequency and voltage according to embodiments of the present invention.

Aspects of the present invention will now be further described with reference to FIGS. 12 and 13. FIG. 12 depicts a graph illustrating a relationship between plate capacitance and drive voltage of a variable capacitor according to embodiments of the present invention. As illustrated in FIG. 12, the variable capacitor of the present invention is capable of operation at very low voltages (V), such as voltages less than or equal to 5 V. This can provide an advantage over conventional variable capacitors utilizing electrostatic actuation that may require high actuation voltage. For example, conventional variable capacitors may require up to ten or more volts to be actuated, whereas some embodiments of the present invention can use less than about 5 V.

Figure 13:
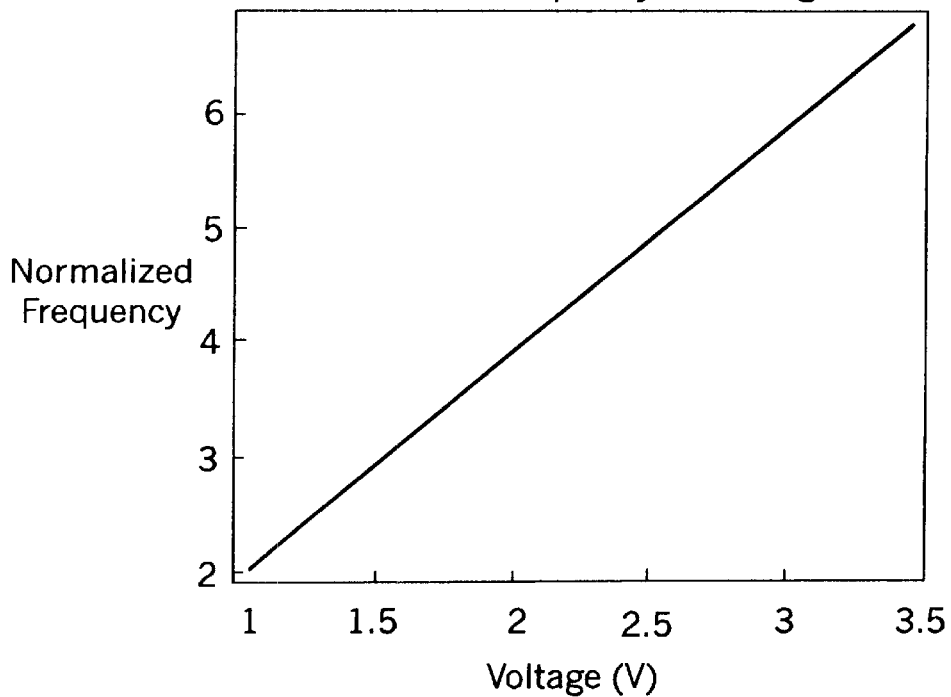
FIG. 13 is a graph illustrating a relationship between angled plate capacitance and voltage according to embodiments of the present invention.

FIG. 13 depicts a graph illustrating a relationship between the normalized frequency response and drive voltage of a variable capacitor according to embodiments of the present invention. Utilizing the variable capacitor described above with respect to FIGS. 1 through 8 in a tunable circuit, such as circuit 900, can produce a highly linear operation as illustrated in FIG. 13. As discussed above, the capacitance of the present invention may be varied by increasing and decreasing the spaced apart relationship between the first and second capacitor plates. This aspect of the present invention can provide a tunable circuit with a wide range of tunable capacitance due to the large range of motion provided by the bimorph members of the present invention.

Accordingly, variable capacitors and associated operating methods of embodiments of the present invention can provide a wide range of capacitance tuning available due to the large range of motion that can be provided by the bimorph members of the present invention. These variable capacitors may be capable of operating at low voltages. Combining variable capacitors of embodiments of the present invention with an inductor to produce an LC filter can produce a tunable circuit having a highly linear operation and a tunable range of about 10:1. Furthermore, changes in ambient temperature may be compensated over a wide ambient temperature range. For example, the variable capacitor of the present invention may provide capacitances in the range of 0.5 pF to 5 pF and may be operable at voltages less than or equal to 5 V and temperatures in the range of −55° C. to approximately 150° C.

Embodiments of the present invention discussed above with respect to FIGS. 1 through 8 may conform to the following specifications: a drive voltage range of 0 V to 5 V or 0 V to 3.3 V (preferred); a current of 10 mA; a power of 50 mW; a capacitance ratio of 8 to 10; a minimum capacitance of 0.5 pF; a maximum capacitance of 5 pF; a series resistance of 1.5 Ohms; a resistance of 100 Ohms; a Q range of 50 to 100; a frequency range of 1–2 GHz; a junction temperature of 125° C. or 150° C.; and an operating temperature range of −55° C. to 150° C. Furthermore, embodiments of the present invention may conform to the following sizing specifications: a bimorph member may be 250 μm wide and 500 μm long having a 2 μm layer of silicon, 1.5 μm layer of nitride and 2 μm layer of nickel; and a capacitor plate may be 500 μm by 500 μm.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed is:

1. A variable capacitor, comprising:
   a substrate;
   a first bimorph member that is spaced apart from the substrate;
   a first capacitor plate that is mechanically coupled to the first bimorph member;
   a second bimorph member that is spaced apart from the substrate;
   a second capacitor plate that is mechanically coupled to the second bimorph member, and positioned in a spaced apart relationship to the first capacitor plate; and
   an actuator associated with at least one of the first and second bimorph members and that is configured to vary the spaced apart relationship between the first and second capacitor plates.

2. The variable capacitor of claim 1, wherein the first bimorph member comprises first and second layers having dissimilar thermal coefficients of expansion, and wherein the second bimorph member comprises third and fourth layers having dissimilar coefficients of expansion.

3. The variable capacitor of claim 2, further comprising:
   a first insulating layer positioned between the first and second layers; and
   a second insulating layer positioned between the third and fourth layers.

4. The variable capacitor of claim 3, wherein the first and second insulating layers comprise silicon nitride.

5. The variable capacitor of claim 2, wherein the first and third layers comprise a first material, and wherein the second and fourth layers comprise a second material.

6. The variable capacitor of claim 5, wherein the first material comprises polysilicon, and wherein the second material comprises nickel.

7. The variable capacitor of claim 1, wherein the actuator is associated with the first and the second bimorph members and is configured to vary the spaced apart relationship between the first and second capacitor plates.

8. The variable capacitor of claim 1, further comprising:
   a third bimorph member that is spaced apart from the substrate; and
   a third capacitor plate that is mechanically coupled to the third bimorph member, and positioned between the first and second capacitor plates;
   wherein the actuator is associated with the third bimorph member and configured to increase the spaced apart relationship between the third capacitor plate and one of the first and second capacitor plates and to decrease the spaced apart relationship between the third capacitor plate and the other of the first and second capacitor plates.

9. The variable capacitor of claim 1, further comprising:
   a third bimorph member that is spaced apart from the substrate;
   a third capacitor plate that is mechanically coupled to the third bimorph member;
   a fourth bimorph member that is spaced apart from the substrate; and
   a fourth capacitor plate that is mechanically coupled to the fourth bimorph member;
   wherein the first, second third and fourth capacitor plates are positioned such that the first, second and third capacitor plates face the fourth capacitor plate; and
   wherein the actuator is associated with at least one of the first, second, third and fourth bimorph members and is configured to vary the spaced apart relationship between the first, second, third, and fourth capacitor plates.

10. The variable capacitor of claim 1, wherein the actuator comprises at least one of a thermal actuator, an electrostatic actuator and an electromagnetic actuator.

11. The variable capacitor of claim 10, wherein the thermal actuator is responsive to a current.

12. The variable capacitor of claim 1, further comprising a trench in the substrate, wherein the at least one of the first and second bimorph members deflects into the trench responsive to the actuator.

13. The variable capacitor of claim 1, further comprising a trench in the substrate, wherein the first and second bimorph members deflect into the trench responsive to ambient temperature.

14. The variable capacitor of claim 1, wherein the at least one of the first and second bimorph members deflects away from the substrate in response to the actuator.

15. The variable capacitor of claim 1 in combination with an inductor that is electrically connected thereto to form an LC filter.

16. The variable capacitor of claim 1, further comprising a dielectric comprising air between the first and second capacitor plates.

17. The variable capacitor of claim 1, further comprising a dielectric comprising a first dielectric material and a second dielectric material between the first and second capacitor plates.

18. The variable capacitor of claim 17, wherein the first dielectric material is air.

19. A variable capacitor, comprising:
   first and second capacitor plates positioned to face one another in a spaced apart relationship;
   a tandem mover that is configured to move the first and second capacitor plates in tandem in response to changes in ambient temperature; and
   an actuator that is configured to vary the spaced apart relationship between the first and second capacitor plates in response to an external input.

20. The variable capacitor of claim 19, further comprising:
   a third capacitor plate positioned between the first and second capacitor plates;
      wherein the tandem mover is configured to move the first, second, and third capacitor plates in response to changes in ambient temperature; and
      wherein the actuator is configured to increase the spaced apart relationship between the third capacitor plate and one of the first and second capacitor plates and decrease the spaced apart relationship between the third capacitor plate and the other of the first and second capacitor plates.

21. The variable capacitor of claim 19, further comprising:
   third and fourth capacitor plates positioned such that the first, second and third capacitor plates face the fourth capacitor plate in a spaced apart relationship; and
   wherein at least one of the first, second, third and fourth capacitor plates is responsive to the actuator that is configured to vary the spaced apart relationship between the first, second, third, and fourth capacitor plates.

22. The variable capacitor of claim 19, wherein the actuator comprises at least one of a thermal actuator, an electrostatic actuator and an electromagnetic actuator.

23. The variable capacitor of claim 22, wherein the thermal actuator is responsive to a current.

24. The variable capacitor of claim 19 in combination with an inductor that is electrically connected thereto to form an LC filter.

* * * * *

UNITED STATES PATENT AND TRADEMARK OFFICE
CERTIFICATE OF CORRECTION

PATENT NO.    : 6,400,550 B1
DATED         : June 4, 2002
INVENTOR(S)   : Wood et al.

It is certified that error appears in the above-identified patent and that said Letters Patent is hereby corrected as shown below:

<u>Title page,</u>
Item [54], the Title should read as follows:
-- VARIABLE CAPACITORS INCLUDING TANDEM MOVERS/BIMORPHS --

Signed and Sealed this

Twelfth Day of November, 2002

*Attest:*

*Attesting Officer*

JAMES E. ROGAN
*Director of the United States Patent and Trademark Office*